US007187108B2

(12) United States Patent
Hasegawa et al.

(10) Patent No.: US 7,187,108 B2
(45) Date of Patent: Mar. 6, 2007

(54) ULTRASONIC PROBE

(75) Inventors: Yasunobu Hasegawa, Saitama (JP); Yoshihiro Tahara, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 106 days.

(21) Appl. No.: 11/102,058

(22) Filed: Apr. 8, 2005

(65) Prior Publication Data

US 2005/0236930 A1 Oct. 27, 2005

(30) Foreign Application Priority Data

Apr. 16, 2004 (JP) ............................ 2004-121031

(51) Int. Cl.
*H01L 41/08* (2006.01)

(52) U.S. Cl. ...................................... 310/334; 310/326

(58) Field of Classification Search ........ 310/334–336, 310/341–342, 344, 346; *H04L 41/08*
See application file for complete search history.

(56) References Cited

U.S. PATENT DOCUMENTS 4,387,720 A * 6/1983 Miller ........................ 600/472
4,699,150 A * 10/1987 Kawabuchi et al. ........ 600/446
5,577,507 A * 11/1996 Snyder et al. .............. 600/472

FOREIGN PATENT DOCUMENTS

| | | |
|---|---|---|
| JP | 07274297 | * 10/1995 |
| JP | 072747297 | * 10/1995 |
| JP | 2000-115891 | 4/2000 |
| JP | 2004-057806 | 2/2004 |
| JP | 2004057806 | * 2/2006 |

* cited by examiner

*Primary Examiner*—Darren Schuberg
*Assistant Examiner*—Karen Addison
(74) *Attorney, Agent, or Firm*—Scott D. Wofsy; Edwards Angell Palmer & Dodge LLP

(57) ABSTRACT

The invention is constructed such that, in an ultrasonic probe in which a peripheral side face of a piezoelectric plate is covered with a shielding case, and an acoustic matching layer is provided on an ultrasonic wave transmission reception face including the piezoelectric plate and the shielding case, there is provided a voltage proof material on a tip side of the shielding case including at least an aperture end face. Moreover, the piezoelectric plate may be a divided type ultrasonic probe which is divided into two by a shielding plate, and the voltage proof material is provided on the tip side of the shielding plate including the end face. The voltage proof material may be a polyimide tape. As a result, it is possible to provide an ultrasonic probe which has a shielding function, and in which destruction of the acoustic matching layer caused by the applied voltage is prevented. Thus, excellent voltage endurance is maintained.

11 Claims, 2 Drawing Sheets

ULTRASONIC PROBE

BACKGROUND OF THE INVENTION

The present invention relates to an ultrasonic probe, and in particular relates to an ultrasonic probe which has a shielding case.

An ultrasonic probe is used as an ultrasonic wave receiving source, for example of a medical ultrasonic diagnostic apparatus. As this type of ultrasonic probe, there is one where the periphery of a piezoelectric plate is covered with a shielding case.

FIG. 4 is a longitudinal (widthwise) cross-sectional view of a conventional ultrasonic probe.

A conventional ultrasonic probe U comprises, for example, a piezoelectric plate (piezoelectric element) 10, an inner case 20, a shielding case 30, an outer case 40, and an acoustic matching layer 50. The piezoelectric plate 10 has driving (excitation) electrodes on the opposite main faces. Regarding the driving electrode on the front face side, a lead wire 60 which is a connecting portion thereof, is extended to the back face side. Here, a pair of the lead wires 60 are connected to the back face side of the piezoelectric plate 10.

Moreover, the inner case 20 has a step portion 20*a* on its aperture side, which holds the periphery of the piezoelectric plate 10. A backing material 70 which has a damping function, is formed on the back face side of the piezoelectric plate 10, for example by pouring a synthetic resin into the inner case 20. The shielding case 30 is provided on the periphery of the inner case 20, and has the aperture end face thereof made close to the wave transmission reception face so as to cover the periphery of the piezoelectric plate 10. Accordingly, this prevents the entry of external noise to the inside of the ultrasonic probe U, and acts to prevent erroneous diagnosis.

Furthermore, the outer case 40 is provided on the periphery of the shielding case 30. The acoustic matching layer 50 is provided on the aperture end face of the piezoelectric plate 10, the inner case 20, the shielding case 30, and the outer case 40, so as to cover the whole ultrasonic wave transmission reception face. The thickness of the acoustic matching layer 50 which is provided facing the front face of the piezoelectric plate 10, is generally set to ¼ of the wavelength λ of the ultrasonic wave. Moreover, in order to ensure the safety of a living body in contact with the wave transmission reception face, as shown in FIG. 4, the acoustic matching layer 50 is provided over the whole wave transmission reception face.

(See Japanese Unexamined Patent Publication (KOKAI) No. 2000-115891, and to Japanese Unexamined Patent Publication (KOKAI) No. 2004-57806).

However, in this type of conventional ultrasonic probe U there is a problem in that, due to the shielding case 30, it is not possible to maintain good voltage endurance. That is, in the ultrasonic probe U having such a construction, since the aperture end face 30*a* of the shielding case 30 has a small width and a high voltage is applied, an electric field is concentrated in the vicinity (at the tip) of the aperture end face 30*a*. Accordingly, there is a problem of destruction of the acoustic matching layer 50, particularly that which is located in the vicinity of the aperture end face 30*a*, shown by the imaginary line P in FIG. 4.

In this kind of ultrasonic probe, generally, even if a voltage of 4 KV is applied, without causing destruction of the acoustic matching layer 50. Voltage endurance under normal operation should be ensured. For example, inspection is performed by applying a voltage of 4 kV to the front face of the acoustic matching layer 50, with the driving electrodes on both the main faces of the piezoelectric plate 10, and the shielding case 30 externally connected and made earth potential.

An object of the present invention is to provide an ultrasonic probe which has a shielding function, and in which excellent voltage endurance is maintained.

SUMMARY OF THE INVENTION

The present invention is constructed such that, in an ultrasonic probe in which a peripheral side face of a piezoelectric plate is covered with a shielding case, and an acoustic matching layer is provided over the whole ultrasonic wave transmission reception face including the piezoelectric plate and the shielding case, there is provided a voltage proof material on a tip side of the shielding case including at least an aperture end face.

According to the above construction, the applied voltage is divided by the voltage proof material, thus enabling prevention of destruction of the acoustic matching layer on the tip side of the shielding case.

DETAILED DESCRIPTION OF THE PREFERRED EMBODIMENTS

The present invention is constructed such that, in an ultrasonic probe in which a peripheral side face of a piezoelectric plate is covered with a shielding case, and an acoustic matching layer is provided over the whole ultrasonic wave transmission reception face including the piezoelectric plate and the shielding case, there is provided a voltage proof material on a tip side of the shielding case including at least an aperture end face.

In the present invention, the piezoelectric plate is further divided by a shielding plate, and the voltage proof material is provided on the tip side of the shielding plate including the end face. Accordingly, if the piezoelectric plate is a divided type, in particular a Doppler type, destruction of the acoustic matching layer at the tip side of the shielding plate is prevented.

Moreover, in the present invention, the voltage proof material is a polyimide tape. As a result, the voltage endurance can be readily increased.

[First Embodiment]

Figure 1A:
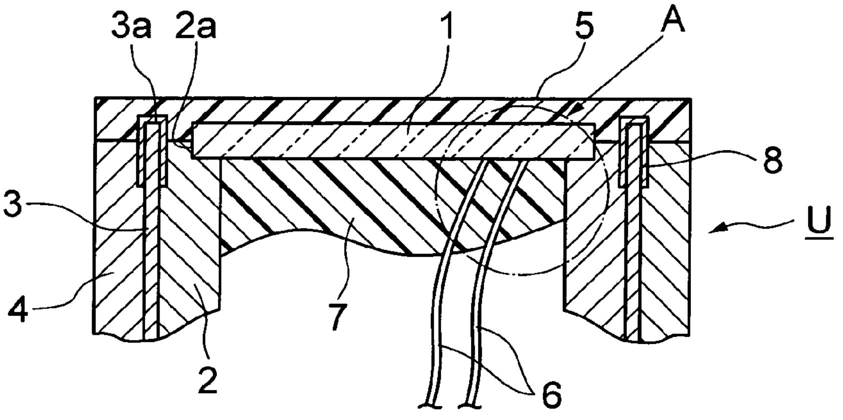
FIG. 1A is a widthwise cross-sectional view explaining a first embodiment of an ultrasonic probe of the present invention, taken along lead wires.

FIG. 1A is a widthwise cross-sectional view explaining a first embodiment of an ultrasonic probe of the present invention.

As shown in FIG. 1A, in the ultrasonic probe U of the present invention, a piezoelectric plate 1 filled with a backing material 7 on the back face side, is held in a step portion 2*a* of an inner case 2. Moreover, the periphery of the piezoelectric plate 1 is covered with a shielding case 3, and an outer case 4 is provided outside of the shielding case 3. Also an acoustic matching layer 5 is provided over the whole ultrasonic wave transmission reception face.

Figure 1B:
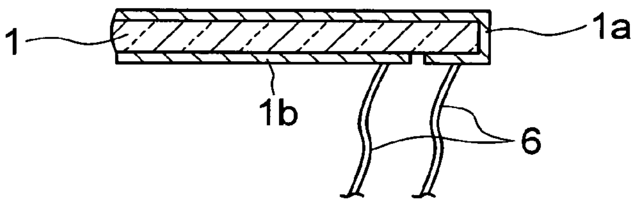
FIG. 1B is an enlarged fragmentary cross-sectional view of part A of FIG. 1A, with a backing material not shown.

As shown in FIG. 1B, the piezoelectric plate 1 has driving (excitation) electrodes 1*a* and 1*b* on the opposite main faces. Regarding the driving electrode 1*a* on the front face side, a lead wire 6 which is a connecting portion thereof, is extended to the back face side. Here, a pair of the lead wires 6 are connected to the back face side. The backing material 7 is filled by pouring a synthetic resin or the like, after connecting the lead wires 6 to the piezoelectric plate 1.

In this first embodiment, a voltage proof material 8 is provided on the tip side of the shielding case 3 including an aperture end face 3*a*. Here, the voltage proof material 8 is made from a commercial resin tape comprising for example a polyimide, and is adhered to the whole periphery of the tip side of the shielding case 3. The voltage endurance of this resin tape is roughly 400 KV/mm. In this example the thickness is 25 μm, and hence the voltage endurance is 10 KV.

Figure 2:
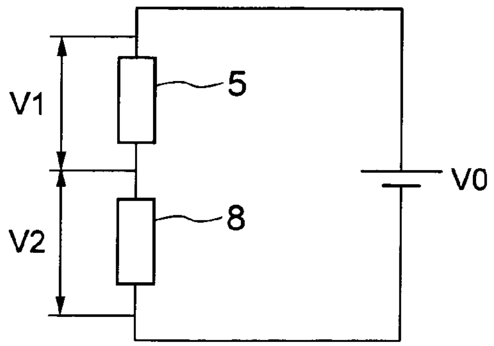
FIG. 2 is a schematic diagram explaining the operation and effect of the first embodiment of the present invention

According to such a construction, as schematically shown in FIG. 2, a voltage V0 applied between the transmission reception face of the ultrasonic probe U, and earth is divided by the acoustic matching layer 5 and the voltage proof material (made from polyimide tape) 8, to give voltages V1 and V2 respectively. Moreover, since an epoxy resin having a voltage endurance of 20 KV/mm is generally used for the acoustic matching layer 5, the insulation resistance of the voltage proof material 8 made from polyimide resin is remarkably increased. For example, if polyimide resin having a voltage endurance of 10 KV and an epoxy resin having a voltage endurance of 2.76 KV are used, the insulation resistance becomes 12.76 KV.

Accordingly, since the divided voltage V1 applied to the acoustic matching layer 5 is decreased, voltage destruction of the acoustic matching layer 5 can be prevented.

[Second Embodiment]

Figure 3:
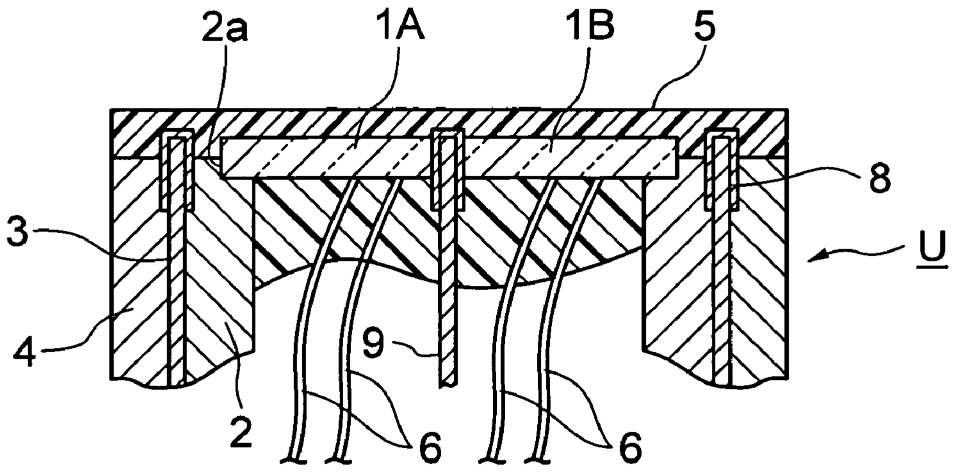
FIG. 3 is a widthwise cross-sectional view explaining a second embodiment of the ultrasonic probe of the present invention.
Figure 4:
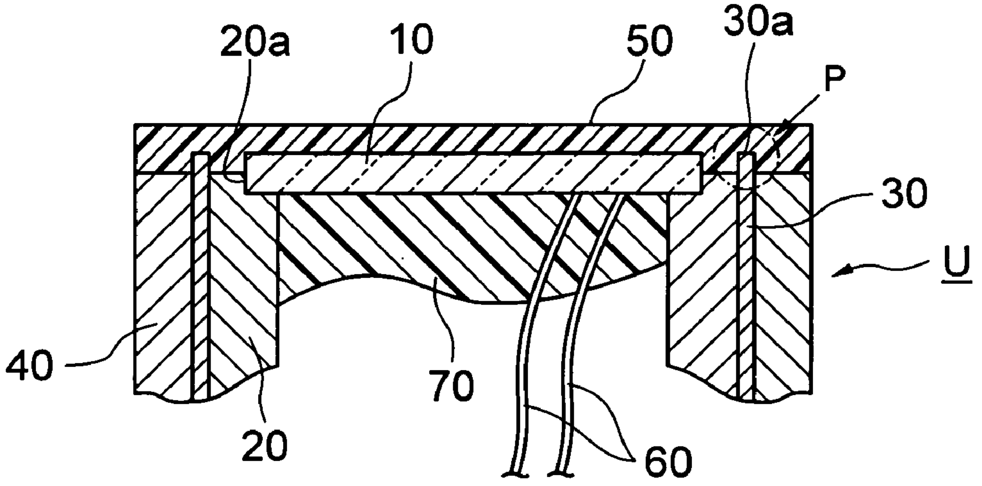
FIG. 4 is a widthwise cross-sectional view of a conventional ultrasonic probe.

FIG. 3 is a widthwise cross-sectional view explaining a second embodiment of the ultrasonic probe U of the present invention.

In this second embodiment, the ultrasonic probe U comprises a sending piezoelectric plate 1A and a receiving piezoelectric plate 1B, made by dividing into two the piezoelectric plate 1 which is held in the step portion 2*a* of the inner case 2 covered with the outer case 4, and which is connected respectively to pairs of lead wires 6. Moreover, a shielding plate 9 is provided between the sending piezoelectric plate 1A and the receiving piezoelectric plate 1B. With this, for example, ultrasonic waves are sent from the sending piezoelectric plate 1A, and these are received by the receiving piezoelectric plate 1B. This is known as a so-called the Doppler type which, particularly in medical use, measures blood flow and the like. In this case, it becomes an air damper in which the backing material is not used.

Here the polyimide tape used as the abovementioned voltage proof material 8 is adhered to the respective tip sides including the end faces of the shielding case 3 and the shielding plate 9. According to such a construction, destruction of the acoustic matching layer 5 on the tip side of the shielding plate 9 can be prevented, for a similar reason to that of the first embodiment.

In the embodiments of the present invention, the voltage proof material 8 comprises polyimide tape. However, it is not limited to this, and for example a voltage proof resin may be applied (coated) onto the tip of the shielding case 3 and the shielding plate 9. Moreover, the shielding case 3 is disposed between the inner case 2 and the outer case 4. However, the present invention is applicable to all constructions in which the periphery of the piezoelectric plate 1 is covered with the periphery of the shielding case 3, and the acoustic matching layer 5 is provided. Furthermore, in the embodiments of the present invention, the piezoelectric plate 1 is a single plate or a partitioned plate. However, the present invention is also similarly applicable to an array type in which a plurality of piezoelectric elements are arranged.

What is claimed is:

1. An ultrasonic probe in which a peripheral side face of a piezoelectric plate is covered with a shielding case, and an acoustic matching layer is provided on an ultrasonic wave transmission reception face including said piezoelectric plate and said shielding case, wherein there is provided a voltage proof material on a tip side of said shielding case including at least an aperture end face, and wherein said voltage proof material has a voltage endurance that is greater than a voltage endurance of said acoustic matching layer.

2. An ultrasonic probe according to claim 1, wherein said piezoelectric plate is divided by a shielding plate, and said voltage proof material is provided on the tip side of said shielding plate including the end face.

3. An ultrasonic probe according to claim 1, wherein said voltage proof material is an adhered polyimide tape.

4. An ultrasonic probe according to claim 1, wherein said voltage proof material is a coated resin.

5. An ultrasonic probe according to claim 1, wherein said piezoelectric plate comprises a single plate.

6. An ultrasonic probe according to claim 1, wherein said piezoelectric plate comprises a partitioned plate.

7. An ultrasonic probe according to claim 1, wherein said piezoelectric plate comprises a plurality of piezoelectric elements arranged in a widthwise direction.

8. An ultrasonic probe in which a peripheral side face of a piezoelectric plate is covered with a shielding case, and an acoustic matching layer is provided on an ultrasonic wave transmission reception face including said piezoelectric plate and said shielding case, wherein there is provided a voltage proof material on an entire periphery of a tip side of said shielding case including an outer peripheral surface portion of the tip side of said shielding case, an inner peripheral surface portion of the tip side of said shielding case and an aperture end face of said shielding case.

9. An ultrasonic probe according to claim 8, wherein said voltage proof material has a voltage endurance that is greater than a voltage endurance of said acoustic matching layer.

10. An ultrasonic probe according to claim 8, wherein said voltage proof material is an adhered polyimide tape.

11. An ultrasonic probe according to claim 8, wherein said voltage proof material is a coated resin.

* * * * *